(12) United States Patent
Bickel et al.

(10) Patent No.: US 10,802,081 B2
(45) Date of Patent: Oct. 13, 2020

(54) METHOD AND SYSTEM FOR ANALYZING WAVEFORMS IN POWER SYSTEMS

(71) Applicant: SCHNEIDER ELECTRIC USA, INC., Andover, MA (US)

(72) Inventors: Jon Andrew Bickel, Murfreesboro, TN (US); Michael Edward Luczak, Nashville, TN (US); Karl Gurley Kersey, Nashville, TN (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 692 days.

(21) Appl. No.: 15/090,082

(22) Filed: Apr. 4, 2016

(65) Prior Publication Data

US 2017/0285114 A1 Oct. 5, 2017

(51) Int. Cl.
| | | |
|---|---|---|
| *G01R 31/00* | (2006.01) | |
| *G01R 31/40* | (2020.01) | |
| *G01R 21/133* | (2006.01) | |
| *G01R 19/25* | (2006.01) | |

(52) U.S. Cl.
CPC .......... *G01R 31/40* (2013.01); *G01R 19/2506* (2013.01); *G01R 19/2513* (2013.01); *G01R 21/133* (2013.01)

(58) Field of Classification Search
CPC .... G01R 13/00; G01R 19/00; G01R 19/2506; G01R 19/2513; G01R 21/133; G01R 22/10; G01R 31/40; G01R 721/133; G01D 4/004; G06F 17/40
USPC ............................................. 702/58, 62, 64
See application file for complete search history.

(56) References Cited

U.S. PATENT DOCUMENTS

| | | | |
|---|---|---|---|
| 5,224,054 A | 6/1993 | Wallis | |
| 5,233,538 A | 8/1993 | Wallis | |
| 2009/0150686 A1 | 6/2009 | Muthu-Mannivannan et al. | |
| 2009/0187344 A1 | 7/2009 | Brancaccio et al. | |
| 2010/0324845 A1* | 12/2010 | Spanier .............. | G01R 19/2513 702/62 |

(Continued)

FOREIGN PATENT DOCUMENTS

| | | |
|---|---|---|
| EP | 2980594 A1 | 2/2016 |
| WO | 20090134832 A2 | 11/2009 |

(Continued)

OTHER PUBLICATIONS

Extended European Search Report from corresponding European Application No. 17164374.5 dated Aug. 29, 2017.

*Primary Examiner* — Brook Kebede
(74) *Attorney, Agent, or Firm* — Lando & Anastasi, LLP

(57) ABSTRACT

A method and system for analyzing waveform capture data is provided. In one aspect, the method comprises receiving, by a controller from an intelligent electronic device, waveform capture data indicative of an electrical event, extracting, from the waveform capture data, electrical event data, extracting, from memory associated with the controller, additional data, classifying the waveform capture data into a category of a plurality of categories using the electrical event data, comparing the electrical event data and the additional data to stored data, diagnosing the electrical event and a cause of the electrical event based on the comparison and providing an indication of the cause of the electrical event.

23 Claims, 8 Drawing Sheets

(56) References Cited

U.S. PATENT DOCUMENTS

| | | | | |
|---|---|---|---|---|
| 2011/0004324 A1* | 1/2011 | Bickel | ............... | G01D 4/002 700/3 |
| 2012/0078555 A1* | 3/2012 | Banhegyesi | ........ | G01D 4/004 702/64 |
| 2013/0096854 A1* | 4/2013 | Schweitzer, III | .... | G01R 31/085 702/59 |
| 2013/0346419 A1 | 12/2013 | Hewitt et al. | | |
| 2015/0160296 A1 | 6/2015 | Saarinen et al. | | |
| 2015/0185258 A1 | 7/2015 | Song et al. | | |

FOREIGN PATENT DOCUMENTS

| | | |
|---|---|---|
| WO | 20110156400 A1 | 12/2011 |
| WO | 2014084980 A1 | 6/2014 |

* cited by examiner

| Categories | Typical Duration | Types |
|---|---|---|
| Transients | Less than 1 Cycle | Impulsive or Oscillatory |
| Short Duration Variations | 1/2 cycles to 1 Minute | Sags, Swells, Interruptions |
| Long Duration Variations | Over 1 Minute | Under-voltages, Over-voltages, Sustained Interruptions |
| Voltage Imbalance | Steady State | |
| Waveform Distortions | Steady State | Harmonics, Notching |
| Voltage Fluctuation | Intermittent | |
| Frequency Variations | Less than 10 Seconds | |

FIG. 4

METHOD AND SYSTEM FOR ANALYZING WAVEFORMS IN POWER SYSTEMS

BACKGROUND OF DISCLOSURE

1. Field of Disclosure

Embodiments of the present disclosure relate generally to systems and methods for characterization and analysis of waveform data in power monitoring systems.

2. Discussion of Related Art

Intelligent Electronic Devices (IEDs), such as conventional power metering devices, are often capable of acquiring a univariate or multivariate time-series of electrical signal data samples, such as current and/or voltage data samples, over a window of time. In some IEDs, if the measured current and/or voltage signals exceed or drop below a predetermined threshold, the IED will automatically store the waveform data and generate a waveform capture, which provides a graphical representation of how a signal (e.g., a current and/or voltage signal) varies over time.

Waveform captures are typically generated by IEDs in response to unanticipated electrical events causing variations in the voltage and/or current signals in an electrical system. The results of the unanticipated electrical events can be benign, but often lead to power-quality-induced complications, including equipment damage, equipment failure, and safety concerns. The waveform capture data can be analyzed to diagnose the electrical event(s), enabling faster mitigation and resolution of the power-quality-induced complications.

SUMMARY OF DISCLOSURE

At least one aspect of the disclosure is directed to a method for analyzing waveform capture data, the method comprising receiving, by a controller from an intelligent electronic device, waveform capture data indicative of an electrical event, extracting, from the waveform capture data, electrical event data, extracting additional data from memory associated with the controller, classifying the waveform capture data into a category of a plurality of categories using the electrical event data, comparing the electrical event data and the additional data to stored data, diagnosing the electrical event and a cause of the electrical event based on the comparison, and providing an indication of the cause of the electrical event.

In one embodiment, the additional data includes at least one of metadata, event data and intelligent electronic device information. In another embodiment, the method further includes analyzing waveform capture data that includes waveform disturbances caused by known electrical events, and writing analysis results into the stored data. In one embodiment, the method further includes automatically mitigating the cause of the electrical event. According to one embodiment, the method further includes storing a diagnosis of the electrical event and the cause of the electrical event in a file. In some embodiments, the diagnosis of the electrical event and the cause of the electrical event are stored using a .CAT file format. In one embodiment, the diagnosis of the electrical event and the cause of the electrical event are stored using one or more of an XML format, a PQDIF format and a COMTRADE format. According to some embodiments, the method further includes requesting additional information from an intelligent electronic device. In one embodiment, the method further includes modifying a diagnosis based in part on the additional information.

According to one embodiment, a waveform analysis system is provided, the system comprising at least one intelligent electronic device, and a controller having at least one memory and configured to receive waveform capture data from the at least one intelligent electronic device, the waveform capture data being indicative of an electrical event, extract electrical event data from the waveform capture data, extract additional data from the at least one memory, classify the waveform capture data into a category of a plurality of categories using the electrical event data, compare the electrical event data and the additional data to stored data, diagnose the electrical event and a cause of the electrical event based on the comparison, and provide an indication of the cause of the electrical event.

In one embodiment, the additional data includes at least one of metadata, event data and intelligent electronic device information. In some embodiments, the controller is further configured to analyze waveform capture data including waveform disturbances caused by known electrical events, and write analysis results into the at least one memory. According to some embodiments, the controller is further configured to automatically mitigate the cause of the electrical event. In one embodiment, the controller is further configured to store a diagnosis of the electrical event and the cause of the electrical event in a file. In some embodiments, the file is stored using a .CAT file format. According to one embodiment, the file is stored using one or more of an XML format, a PQDIF format and a COMTRADE format. In some embodiments, the controller is further configured to request additional information from the at least one intelligent electronic device. In one embodiment, the controller is further configured to modify a diagnosis based in part on the additional information.

According to one embodiment, a waveform analysis system is provided, the system comprising at least one intelligent electronic device, and means for receiving waveform capture data from the at least one intelligent electronic device, extracting electrical event data from the waveform capture data, extracting additional data from one or more storage devices, and diagnosing an electrical event and a cause of the electrical event from the electrical event data and the additional data. In one embodiment, the means further comprises means for automatically mitigating the cause of the electrical event based on a diagnosis of the electrical event and the cause of the electrical event.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 4 is a table illustrating power quality classifications;

DETAILED DESCRIPTION OF THE DISCLOSURE

Figure 1:
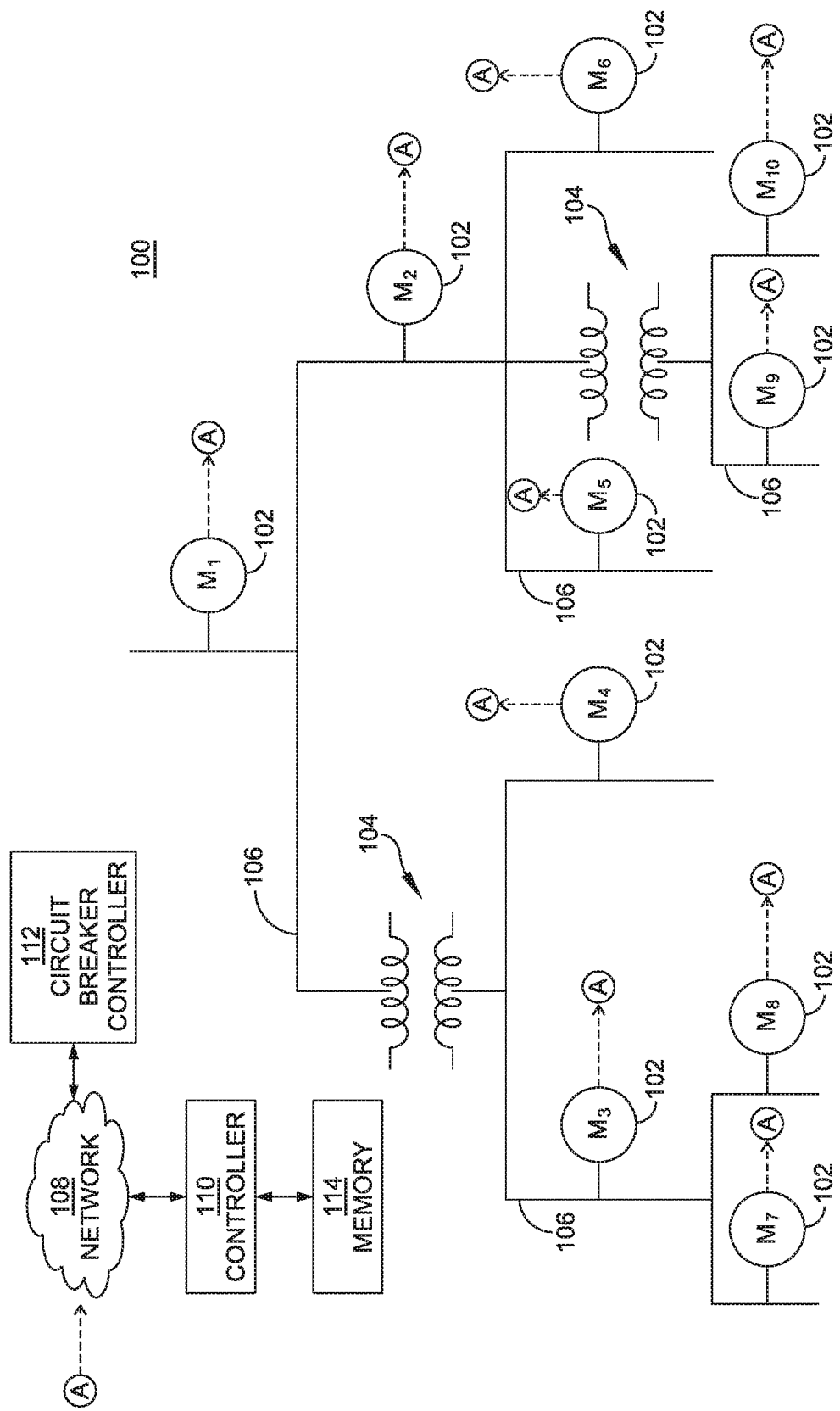
FIG. 1 is a block diagram illustrating a power monitoring system.

Embodiments of this invention are not limited in their application to the details of construction and the arrangement of components set forth in the following description or illustrated in the drawings. Embodiments of the invention are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Analyzing waveform captures derived from waveform capture data is an effective method of troubleshooting potentially-harmful electrical events (e.g., an undesirable voltage sag or voltage swell on the electrical system). Human operators are typically required to diagnose an electrical event from a waveform capture, which can be difficult or even impossible without years of experience. As discussed above, an IED such as a power metering device is typically configured to monitor and record a time-series of data samples, and may be equipped with waveform capture technology to generate waveform captures in response to electrical events. However, each waveform capture must be manually analyzed by an experienced specialist to diagnose an electrical event. Manual data review by an operator is a slow and inefficient means of troubleshooting electrical events, as will be described in greater detail below with respect to FIG. 1.

FIG. 1 illustrates a power monitoring system 100 for monitoring voltage, current, frequency, power, energy and/or other related values measured by one or more IEDs. The power monitoring system 100 includes one or more IEDs 102, one or more transformers 104, an interconnection element 106, a network 108, a controller 110, a circuit breaker controller 112, and a memory element 114. In some embodiments, certain components (e.g., the circuit breaker controller 112) may be distinct from the one or more IEDs 102, while in other embodiments, the components (e.g., the circuit breaker controller 112) may be classified as IEDs themselves (e.g., classified as one or more of the one or more IEDs 102).

Each of the one or more IEDs 102 is coupled to at least one of the one or more transformers 104 via the interconnection element 106, and each of the one or more IEDs 102 is further coupled to the network 108. Each of the one or more transformers 104 is coupled to at least one of the one or more of the IEDs 102 via the interconnection element 106. The network 108 is coupled to each of the one or more IEDs 102, the controller 110 and the circuit breaker controller 112. The controller 110 is coupled to the network 108 and the memory element 114. The circuit breaker controller 112 is coupled to the network 108. The memory element 114 is coupled to the controller 110.

In some embodiments, one or more of the components of the power monitoring system 100 may be not connected to the network 108. For example, one or more of the one or more IEDs 102 may not be coupled to the network 108. Instead, the IEDs can display waveform data information via a front panel proximate to, or affixed to, each of the IEDs rather than providing the waveform data to the network 108. Furthermore, the circuit breaker controller 112 may be connected directly to each of the one or more IEDs 102 (e.g., via the I/O functionality of each of the one or more IEDs 102) in lieu of, or in addition to, being connected to the network 108.

In some embodiments, each of the one or more IEDs 102 is capable of measuring waveform data (e.g., voltages, currents, power, etc.) and automatically generating graphical waveform captures of the waveform data when an electrical event is detected (e.g., due to an undesirable voltage sag or swell on the electrical system). In alternate embodiments, each of the one or more IEDs 102 is capable of measuring waveform data, and the waveform capture data is utilized by an external entity (e.g., a head-end system [e.g., software], an alternate display mechanism, etc.) to generate a graphical waveform capture. In one example, an IED (e.g., M1) of the one or more IEDs 102 may detect an electrical event and generate a waveform capture that illustrates the electrical event, as described in more detail below with respect to FIGS. 2 and 3. In further embodiments, only a subset of the IEDs 102 are configured to measure waveform data and automatically generate graphical waveform captures as discussed above.

As discussed above, manual review of waveform captures is an inefficient and often difficult method of diagnosing electrical events, especially for inexperienced operators. In one embodiment, the controller 110 receives waveform capture data, automatically evaluates the waveform capture data and diagnoses an electrical event and a cause thereof using IED information, metadata and event data.

IED information includes information descriptive of the IED, and in some cases, the associated system that acquired the waveform capture. For example, the IED information can include an IED's sampling rate, IED anti-aliasing capabilities, IED accuracy, IED configuration information, IED potential transformer (PT) and current transformer (CT) information, IED PT/CT ratio information, IED power quality capabilities, IED blind or zero-blind sampling characteristics, IED system type, IED system time synchronization information, IED system clock accuracy, and other characteristics inherent to the IED.

Metadata includes data indicative of the context in which the waveform capture data was acquired. For example, the metadata can include load type information (e.g., motors, heaters, lighting, computers, variable speed drives, etc.), load characteristic information (e.g., standard induction motors exhibit large inrush currents when started, 6-pulse DC drives exhibit harmonic components at the $5^{th}$, $7^{th}$, $11^{th}$, $13^{th}$, $17^{th}$, $19^{th}$, etc. frequencies, etc.), IED locational information (i.e., where within the facility or structure), IED hierarchical information (e.g., how IEDs relate to each other within the monitoring system, etc.), utility service type information (e.g., delta-wye, wye-wye, open-delta-open-wye, etc.), temporal and seasonal information (e.g., time of year, time of day, day of week, month of year, week of year, etc.), environmental information (e.g., associated temperature(s), humidity, inclement weather, etc.), user information (e.g., purpose of business, location of business, operational priorities, etc.), user's operational characteristics (e.g., how is the electrical system controlled, does the facility(s) operate constantly or only certain hours of the day, what is the duty cycle of specific loads, etc.), and so forth.

Event data includes data descriptive of the electrical event. For example, the event data can include instantaneous time-series waveform data, RMS time-series waveform data, event magnitude, event duration, units (e.g., mV, V, kV, mA, A, kA, kW, kWh, kVA, kVAh, kVAr, kVArh, %, etc.), unit range or scale, affected phase or phases (e.g., A-phase, B-phase, C-phase, neutral conductor, ground conductor, etc.), synchronicity of the electrical event on the affected phases, number of system phases (i.e., three-phase, single-phase, etc.), non-fundamental frequency data associated with the event, oscillatory information, symmetry of event, initial polarity of event (e.g., into the waveform, out of the waveform, negative, positive, etc.), event location (e.g., upstream from IED, downstream from IED, etc.), recurrence and repetition information (e.g., whether or not the event is repetitive, how often the event recurs, etc.), date and time data, onset rate characteristics, recovery rate characteristics (e.g., decay rate, etc.), periodicity information (e.g., periodic, aperiodic, intermittent, etc.), frequency correlation (between two or more IEDs) information, affected device information, pre-event data, event data, post-event data, and so forth.

In at least one example, the event data, metadata and IED information are each stored in one or more information libraries. The one or more information libraries may be stored in a memory element (e.g., memory element 114) internal to the controller 110 in some embodiments, while in other embodiments, the information libraries may be externally stored from the controller 110. The controller 110 is operable to access the one or more libraries and update the stored information according to a schedule (e.g., periodically, a-periodically, automatically, manually, etc.). For example, the controller 110 can poll one or more libraries containing information and data that is relevant to electrical event diagnoses, including, for example, libraries containing up-to-date power quality classification standards, up-to-date IED information, up-to-date metadata information, historical information describing previous electrical event diagnoses, and so forth. Accordingly, the controller 110 is kept readily apprised of information used to accurately determine diagnoses.

Furthermore, each characteristic within the information discussed above may be used for one or more applications. Example applications include being used in an electrical event classification stage, being used to diagnose a cause of an electrical event, being used to identify a location of an electrical event, or being used to assess the limitations of an IED used to generate a waveform capture. A combination of the preceding applications can be used to evaluate and mitigate problematic electrical events.

Figure 2:
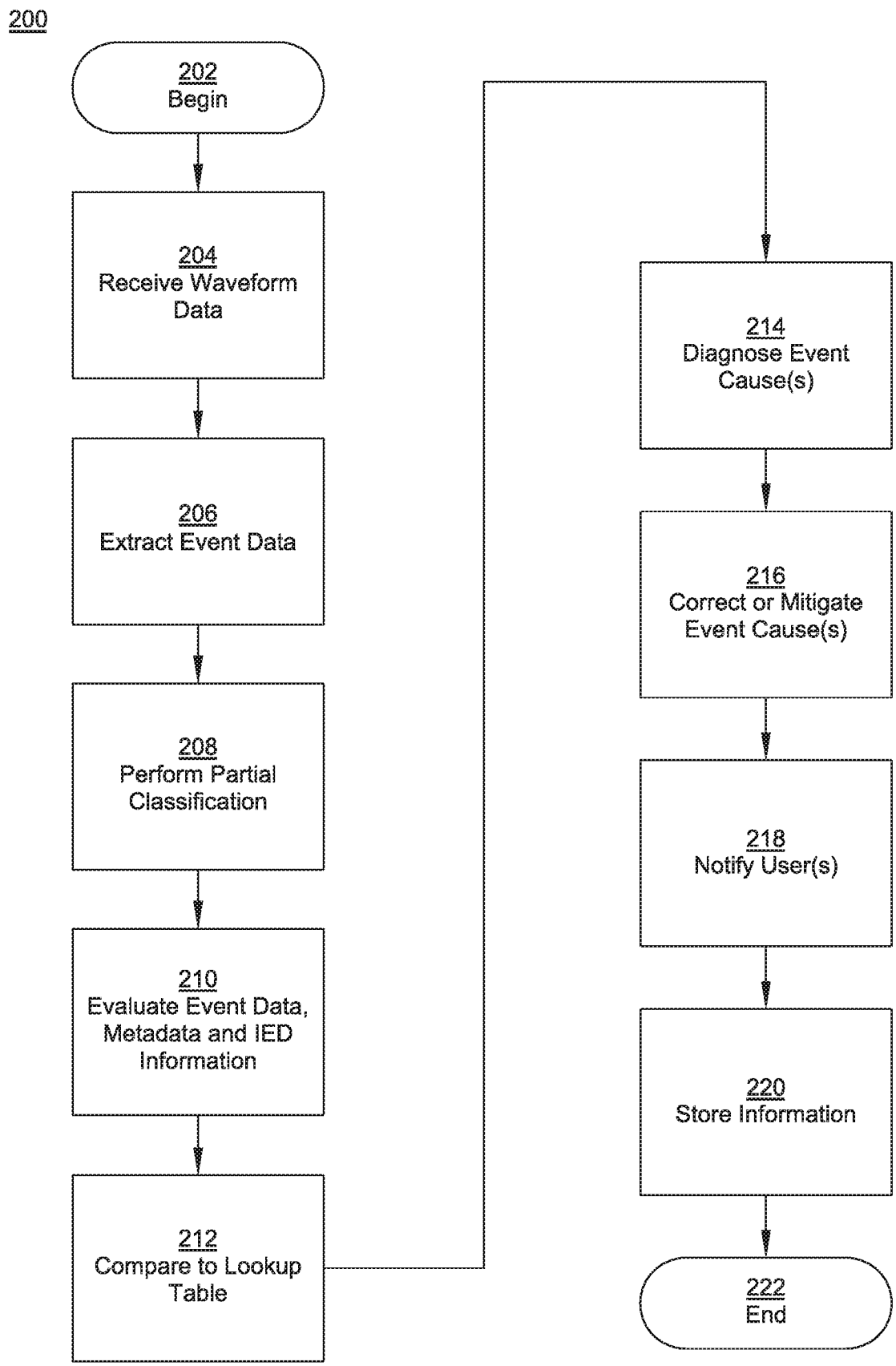
FIG. 2 is a flow diagram illustrating a method of automatically analyzing a waveform capture.
Figure 3:
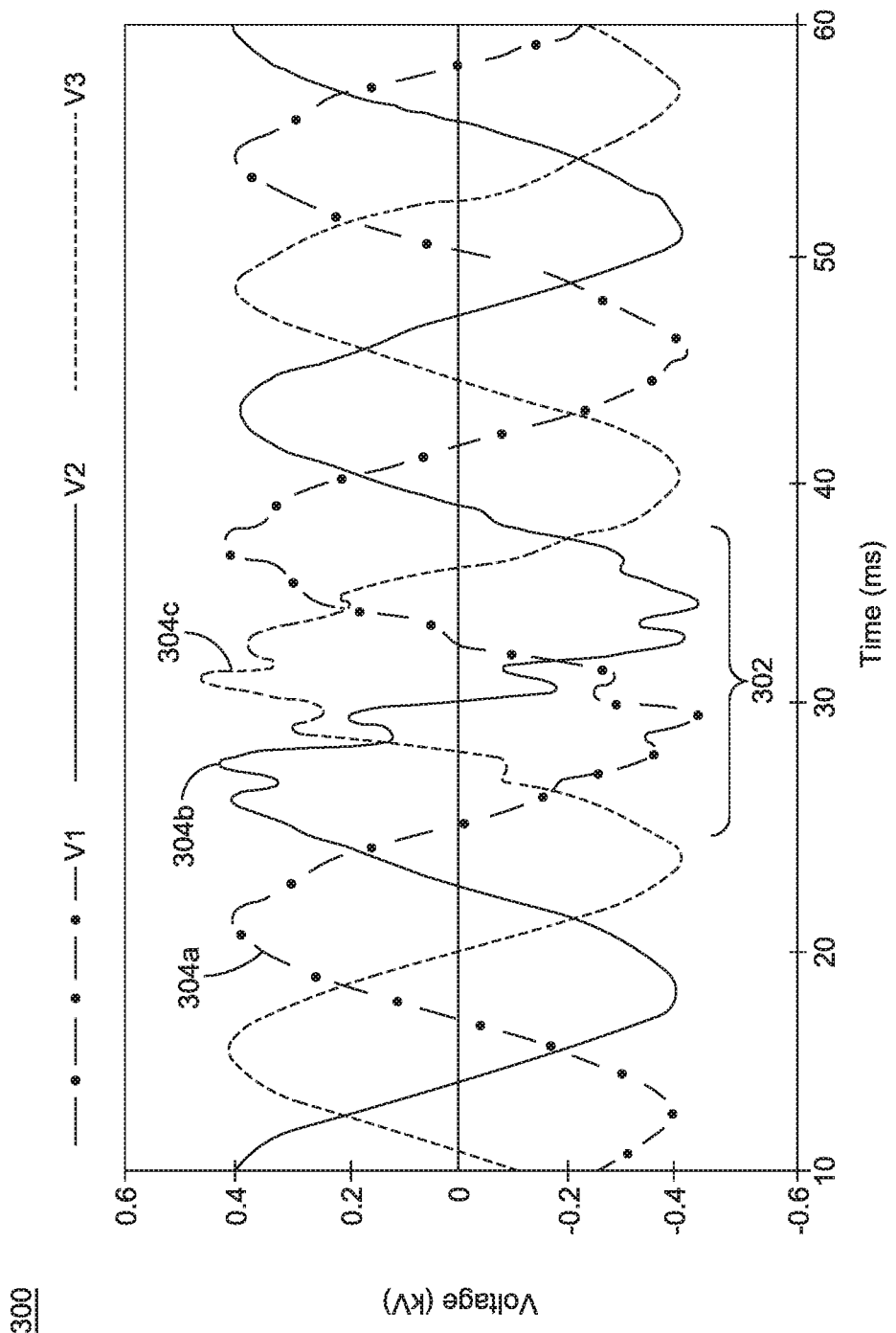
FIG. 3 is a graph illustrating a waveform capture.

FIG. 2 is a process flow diagram 200 executed by the controller 110 in one embodiment to automatically analyze a waveform capture. In other embodiments, the acts described in FIG. 2 may be done in a different order than shown, and some acts may be omitted. At act 202, the process begins. At act 204, the controller 110 receives waveform capture data (e.g., instantaneous waveform data, RMS data, etc.) from an IED (e.g., from one of the one or more IEDs 102). As described above, the occurrence of an electrical event may trigger the IED to automatically detect and capture the corresponding waveform data produced by the electrical event, generate a waveform capture from the waveform data that includes the electrical disturbance and send the waveform capture and waveform data to the controller 110 for analysis. For example, referring to FIG. 3, an example waveform capture 300 produced from the waveform capture data and sent from an IED to a monitoring system software package is shown. As illustrated by FIG. 3, the waveform capture 300 includes an electrical event 302 characterized by fluctuations in three-phase voltage signals 304a, 304b and 304c.

Referring back to FIG. 2, at act 206 the controller 110 extracts event data (e.g., sag data, swell data, notching data, oscillatory information data, etc.) from the waveform capture data. For example, with respect to the waveform capture 300, the controller 110 can extract the event's voltage magnitude data and voltage duration data from the electrical event 302. At act 208, the controller 110 performs a partial event classification on the waveform capture data using the extracted event data pursuant to a selected power quality classification standard (e.g., IEEE 1159, IEC 61000-4-30, EN50160, etc.), as discussed in greater detail below.

For example, the controller 110 may first identify the electrical event 302 as a transient, due to the duration of the electrical event 302 meeting transient classification criteria established by the selected power quality classification standard. The controller 110 may further identify the electrical event 302 as oscillatory due to the ringing effect in the voltage signals 304a, 304b and 304c discussed above. The controller 110 is therefore able to partially classify the electrical event 302 as an oscillatory transient based on the criteria defining as oscillatory transient provided by a selected power quality classification standard. The controller 110 extracts additional event data indicating that the electrical event 302 occurs synchronously in more than one of the three-phase voltage signals 304a, 304b and 304c, and that the initial polarity of the event into the waveform indicates a removal of energy from the system.

At act 210, the controller 110 evaluates the partial classification determined at act 208 against metadata, IED information and the additional event data to further refine the partial classification. For example, the controller 110 may evaluate the sampling rate of the IED that provided the waveform capture to the controller 110 to ensure that the IED is capable of accurately representing the original event signal. The controller 110 may further evaluate a time and date at which the waveform capture was acquired, the synchronicity and initial polarity of the waveform capture, and so forth. At act 212, the controller 110 compares the evaluated symptoms (e.g., represented by a partial classification, additional event data, metadata and IED information) to a lookup table including previously-stored electrical event symptoms and a diagnosed cause of the electrical event, as discussed below with respect to a Wave Shape Learning phase. In alternate embodiments, the controller 110 may compare the evaluated symptoms to a waveform library in lieu of, or in addition to, the lookup table to diagnose a cause of an electrical event. At act 214, the controller 110 diagnoses at least one potential electrical event responsible for causing the observed waveform symptoms.

In some examples, the controller 110 may determine that there are multiple causes for an electrical event, while in other examples there may be a single cause for an electrical event. In the example discussed above with respect to the electrical event 302, the controller 110 can diagnose a cause of an electrical event (e.g., a three-phase capacitor switching event) by comparing the classification information discussed above (i.e., the partial classification [e.g., as an oscillatory transient], the additional event data [e.g., voltage data, current data, event synchronicity information, event polarity information, etc.], the IED information [e.g., IED sampling rate information] and the metadata [e.g., date and time information, hierarchy information, etc.]) against a lookup table or other data storage entity.

The controller 110 may also determine a location at which the electrical event occurred. For example, if the controller 110 only receives disturbance information from a single IED, and all proximate IEDs are capable of recording electrical event information, then the controller 110 can determine that the electrical event occurred proximate to the single IED. Otherwise, if the controller 110 receives disturbance information from multiple IEDs, the controller 110 may determine an electrical event location by assuming that the IED closest to the electrical event observes the most severe electrical event.

At act 216, the controller 110 automatically initiates corrective or mitigative steps to fix the diagnosed cause of the electrical event. For example, the controller 110 may have diagnosed the cause of the electrical event to be a faulty or otherwise malfunctioning component in the system (e.g., power monitoring system 100) and can send control signals to a circuit breaker controller (e.g., circuit breaker controller 112) to disconnect the malfunctioning component from the system. The controller 110 may also directly control one or more devices to function in a different mode of operation (e.g., change when a capacitor bank turns on or off, etc.). In addition, in at least one embodiment, the controller 110 can request additional information from one or more IEDs, and change control parameters of one or more IEDs to assist in determining causes of future electrical events.

At act 218, the controller 110 notifies a user(s) of the occurrence of the electrical event and the steps taken to correct the cause of the electrical event. The notification can be sent graphically, textually, or by any other means to convey information to the user. For example, the notification may be sent via email in one example, while in alternate examples, the notification may be displayed by a Graphical User Interface (GUI) dashboard or report via a smartphone, head-end software, and so forth. The notification can include information indicating the location of the electrical event, information indicating that the cause of the electrical event was, for example, a malfunctioning component, and information indicating that the controller 110 automatically took steps to disconnect the malfunctioning component from the affected system.

The notification can further include recommended steps to be taken to replace or repair the disconnected component accordingly. Furthermore, the notification can include recommended steps suggesting, for example, that a user install additional components to help mitigate an electrical event. For example, to address a capacitor switching event, the notification may include a recommendation that a user install one or more filters to mitigate or correct the issue. At act 220, the analysis information is stored for use in subsequent diagnoses. For example, analysis information stored from previous diagnoses is at least partially used by the controller 110 to determine an electrical event diagnosis at act 212, as discussed above. At act 222, the process ends.

As discussed above with respect to act 208, the controller 110 is operable to perform a partial classification of electrical events in accordance with a selected logical classification structure during a partial classification stage. The controller 110 receives waveform capture data indicative of an electrical disturbance, extracts event data therefrom as discussed above with respect to FIG. 2, and executes a series of determinations. In one example, each determination of the series of determinations is a binary determination pertaining to the waveform capture data to classify the disturbance and the disturbance's associated waveform into an electrical event category from one or more categories defined by a selected power quality classification standard.

Classification of an electrical event into a known electrical event category (e.g., partial classification) can be performed automatically by the controller 110 to streamline the identification of the cause of the electrical event, the classification being performed pursuant to a selected power quality classification standard (e.g., IEEE 1159, IEEE 519, IEC 61000-4-30, EN50160, etc.). The selected power quality classification standard can provide information that assists in determining actions that may be taken to reduce or eliminate the possibility of the identified electrical event from occurring again as discussed above. In some examples, the controller 110 may be operable to automatically execute the prescribed actions, while in other examples, the controller 110 may display the recommendation(s) to an operator in a textual, graphical or other descriptive format.

FIG. 4 illustrates a table 400 of power quality event phenomena categories proposed by a first power quality classification standard. The table 400 includes a categories section 402, a typical duration section 404 and a types section 406. For example, as discussed above with respect to FIG. 3, the electrical event 302 was identified as an oscillatory transient according to the example given, thereby corresponding to a transient category from the categories section 402 and an oscillatory type from the types section 406.

A waveform capture data can be classified into at least one of the categories (e.g., one of the categories from the categories section 402) during the partial classification stage. For example, after waveform capture data is received, the controller 110 evaluates an electrical event illustrated by the waveform capture data. In one example, the controller 110 may initially determine whether the electrical event is periodic or aperiodic. In response to a determination that the electrical event is aperiodic, the controller 110 proceeds to make a next determination, and so forth, until the controller 110 arrives at one of the one or more categories discussed above into which to classify the waveform capture.

The logical classification structure discussed above is one example of a logical structure that can be executed by the controller 110. However, in other examples, there can be a different number of determinations executed (i.e., more or less executed determinations), a different number of results from each determination, and a different number of possible categories into which to classify electrical events. Furthermore, any references to specific determinations executed above are merely examples. Additional or alternate decisions may be executed that deviate from the examples provided herein, and the sequence of decisions leading to each category, the specific number of each category and the specific contents of each category are not limited to the examples provided herein.

Additional examples of determinations to be executed can include, for example, whether the initial polarity of an electrical event is into or out of a waveform (e.g., positive or negative initial polarity, etc.), whether the electrical event is periodic or aperiodic, whether the magnitude of the electrical event is above or below a predetermined threshold, whether the duration of the electrical event is shorter or longer than a selected threshold, whether, if the electrical event is aperiodic, the aperiodic electrical event is a short-duration event, whether, if the electrical event is aperiodic, the aperiodic electrical event is a transient event, whether, if the electrical event is a transient, the transient electrical event is oscillatory or impulsive, whether, if the electrical event is periodic, if the periodic electrical event is a long-duration event, whether, if the electrical event is a long-duration electrical event, the long-duration electrical event is an interruption, whether, if the electrical event is a long-duration electrical event, the long-duration electrical event is an overvoltage, whether, if the electrical event is a long-duration electrical event, the long-duration electrical event is an undervoltage, and so forth.

The controller 110 is further operable to refine the discussed diagnostic processes by executing a Wave Shape Learning procedure on waveform captures that have known electrical event causes. By analyzing the characteristics of a waveform produced by an electrical event with known causes, the controller 110 is operable to store the analysis information in a data storage format (e.g., in a lookup table format) that associates a cause of an electrical event with the characteristic(s) of the electrical event (e.g., observed event data, metadata and IED information). For example, the controller 110 can receive waveform capture data including a disturbance, caused by a known electrical event, during the Wave Shape Learning phase to aid in subsequent diagnoses that involve substantially identical electrical events or characteristic traits. The controller 110 can receive the known waveform capture data or waveform capture from one or more sources including, for example, external information libraries, subject matter experts, and so forth.

For example, with reference to the electrical event 302, the controller 110 may identify a wave shape or wave shapes with characteristics that are substantially identical to previously-learned wave shapes, and can ascribe the stored, known cause of the previously-learned wave shape(s) to the electrical event 302. Accordingly, the controller 110 is operable to identify the cause of the electrical event 302 (e.g., a three-phase capacitor switching event), rather than simply classifying observed event or waveform characteristics of the electrical event 302 (e.g., symptoms of an oscillatory transient).

The received waveform capture information is encoded according to a consistent file format by one or more entities including, for example, software-based entities, hardware-based entities, and so forth. Once a waveform capture has been partially classified as discussed above, information describing the categorization is encoded by the controller 110 for subsequent reference by either the controller 110 or by alternate power quality analysis tools. In at least one example, the information is encoded according to a human-readable format (e.g., encoded in XML format), such as in a .CAT file, such that the encoded information is capable of being consumed by both human users (e.g., because the information is encoded in an XML format) and by computers. Accordingly, the partial classification, the event data, the metadata and the IED information are permanently synchronized by the .CAT file disclosed herein to link an electrical event to information describing the electrical event.

For example, the encoded information can include an electrical event identification tag (e.g., E1, E2, E3, etc.) that uniquely identifies an electrical event, a selected electrical event category (e.g., Category 1, CAT2, Category 8, etc.), a map listing a chain of one or more binary determination decisions made by the controller 110 to arrive at the selected electrical event category, a file containing the waveform capture data that corresponds to the electrical event, and a waveform capture file format (e.g., Common format for Transient Data Exchange for power systems [COMTRADE], Power Quality Data Interchange Format [PQDIF], etc.).

Figure 5:
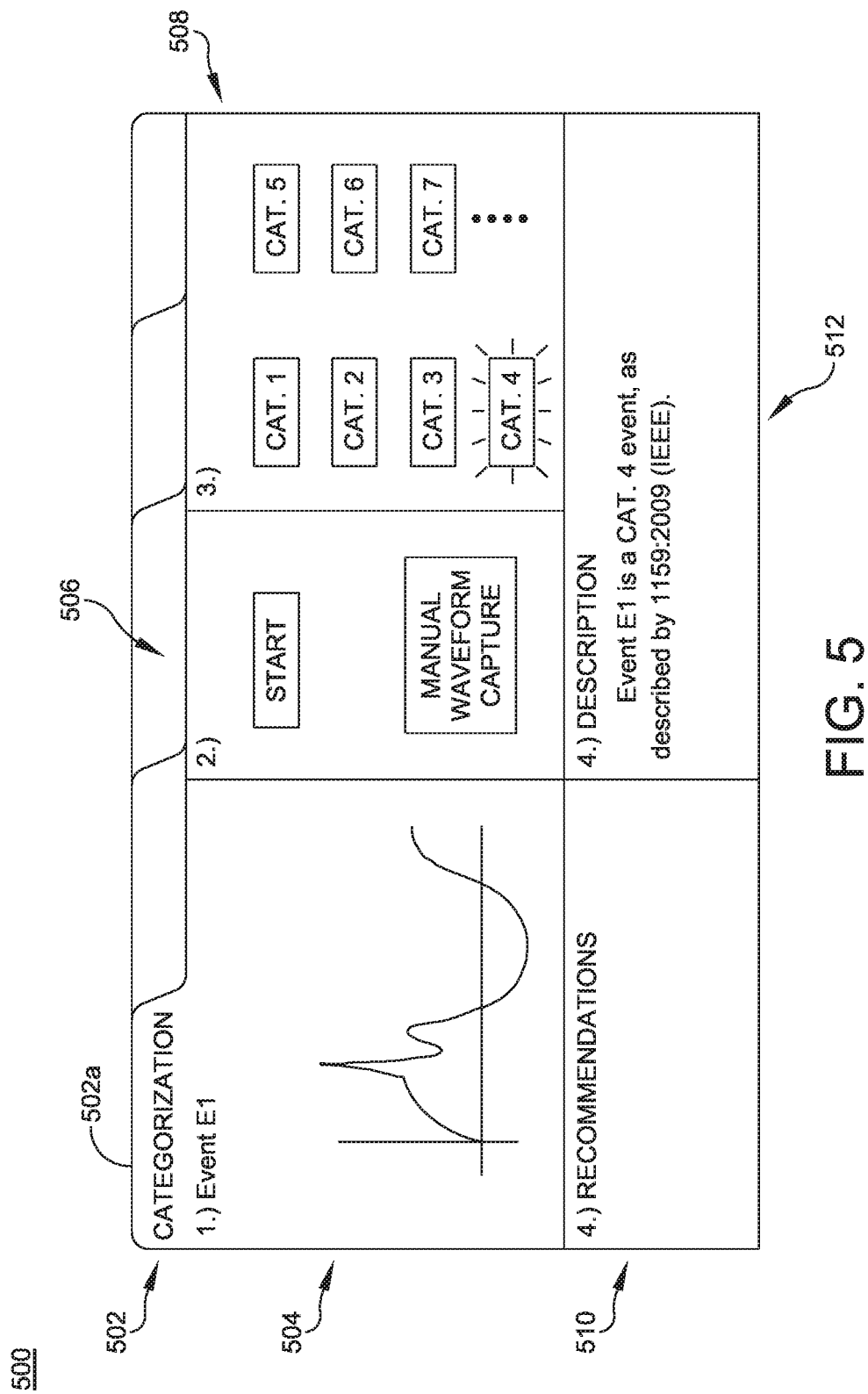
FIG. 5 is an analysis view of a graphical user interface according to one embodiment.

FIG. 5 illustrates a categorization view 500 of a software implementation of a graphical user interface used in one embodiment of the invention. For example, the controller 110 may be operable to display the categorization view 500 responsive to selection of a categorization tab 502a from one or more tabs 502. The categorization view 500 further includes waveform capture information 504, one or more buttons 506, category information 508, recommendation information 510, and event description information 512. The controller 110 may display a waveform capture in the waveform capture information 504 section upon generation of the waveform capture and, responsive to receiving selection of a start button of the one or more buttons 506, the controller 110 is operable to categorize and analyze the waveform capture data as discussed above. Alternatively, the controller 110 may display a waveform capture in the waveform capture information 504 section responsive to receiving selection of a manual waveform capture button of the one or more buttons 506.

The category information 508 section includes information describing a category into which the waveform capture has been placed, and the recommendation information 510 includes one or recommendations suggesting next steps that may be taken by a user (e.g., an operator, facility manager, etc.) to address an underlying electrical event. The event description information 512 includes information describing the waveform capture, such as categorization information and a description thereof.

Figure 6:
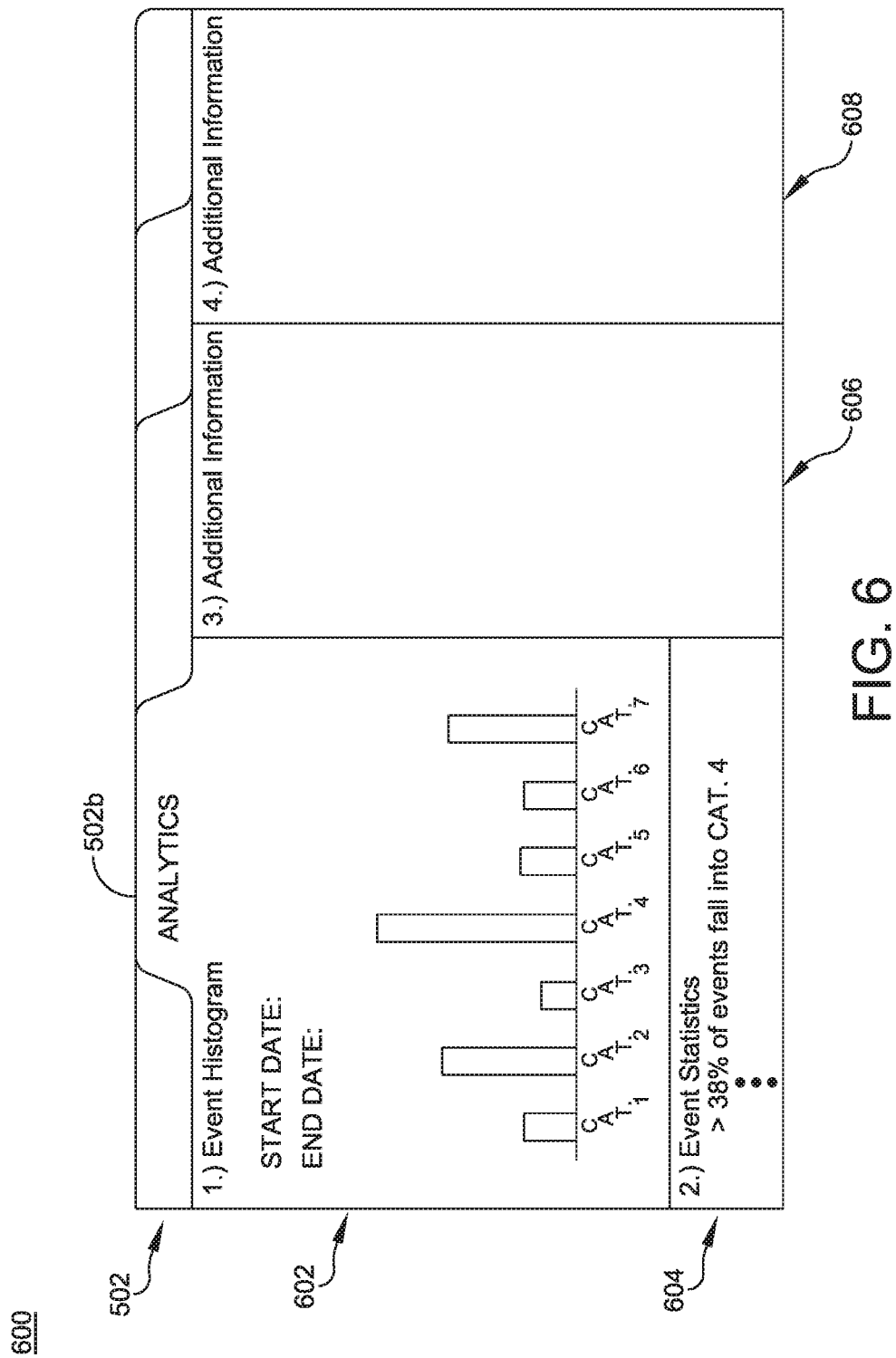
FIG. 6 is a categorization view of a graphical user interface according to one embodiment.

FIG. 6 illustrates an analysis view 600 of a software implementation of a graphical user interface in accordance with one embodiment of the invention. For example, the controller 110 may be operable to display the analysis view 600 responsive to selection of an analytics tab 502b from the one or more tabs 502. The controller 110 can transition between the categorization view 500, the analysis view 600 and any additional views responsive to selection of a tab associated with the corresponding view mode. The analysis view 600 further includes histogram information 602, event statistics 604, and additional information 606, 608. In alternate embodiments, the analysis view 600 can further include pie charts, periodicity charts (e.g., time of day, time of week, etc.), information describing the phase(s) impacted, and so forth.

The histogram information 602 section can include start date and end date settings and, responsive to user specification of a start date and end date, the controller 110 is operable to display a histogram in the histogram information 602 section that represents electrical event categorizations within the selected date range. The event statistics 604 section can expand on the histogram information 602 by displaying statistics pertaining to the histogram information 602. For example, the event statistics 604 section can include a notification that a certain percentage of electrical events fall within a certain category, and so forth. The additional information sections 606, 608 can include further information expanding on, or independent from, the histogram information 602.

Figure 7:
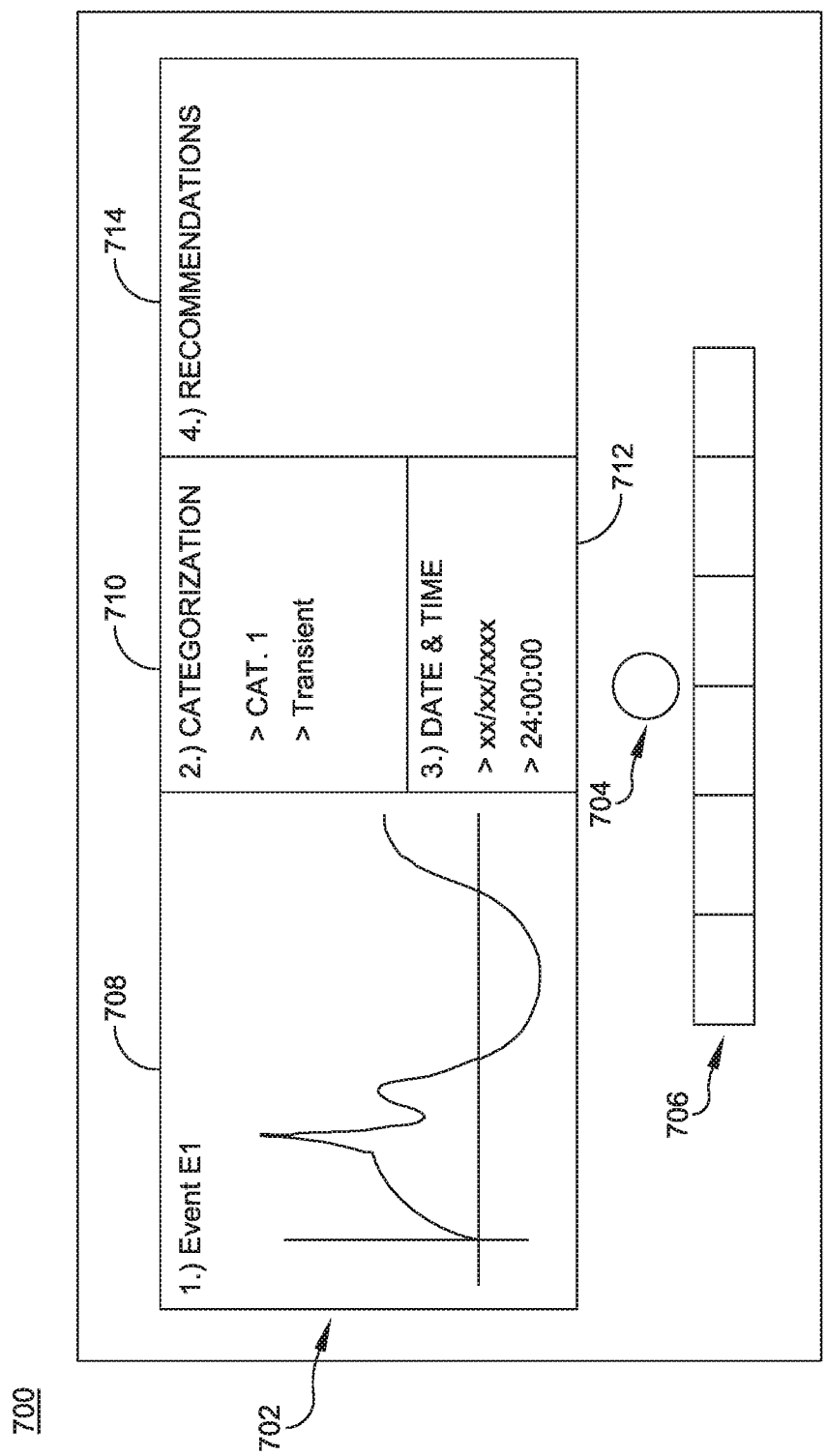
FIG. 7 is a view of an information panel according to one embodiment.

FIG. 7 illustrates a hardware interface 700 that may be coupled to hardware to display event information from a specified IED in accordance with one embodiment. For example, a user can select an IED from one or more IEDs to receive information from via the hardware interface 700. The hardware interface 700 includes a display 702, a status indicator 704, and one or more buttons 706. The display 702 includes waveform capture information 708, categorization information 710, date and time information 712, and recommendation information 714.

The controller 110 is operable to display waveform capture data as a waveform in the waveform capture information 708 section responsive to receiving the waveform capture data. The categorization information 710 includes information about the waveform capture displayed by the waveform capture information 708 section including, for example, a category into which the waveform capture has been placed, a brief description of the category, and so forth. The date and time information 712 section can include a date and time at which the waveform capture was acquired, and the recommendation information 714 section can include recommendations suggesting how to address the disturbance that caused the electrical event. The one or more buttons 706 can be used to navigate through, or interact with, the display 702, and the status indicator 704 may, for example, provide a visual indication when a new waveform capture is generated to notify a user (e.g., an operator) of the waveform capture's existence. The one or more buttons 706 can further include a manual waveform capture button that, upon selection, causes the controller 110 to generate a waveform capture from waveform data provided by a selected IED.

Figure 8:
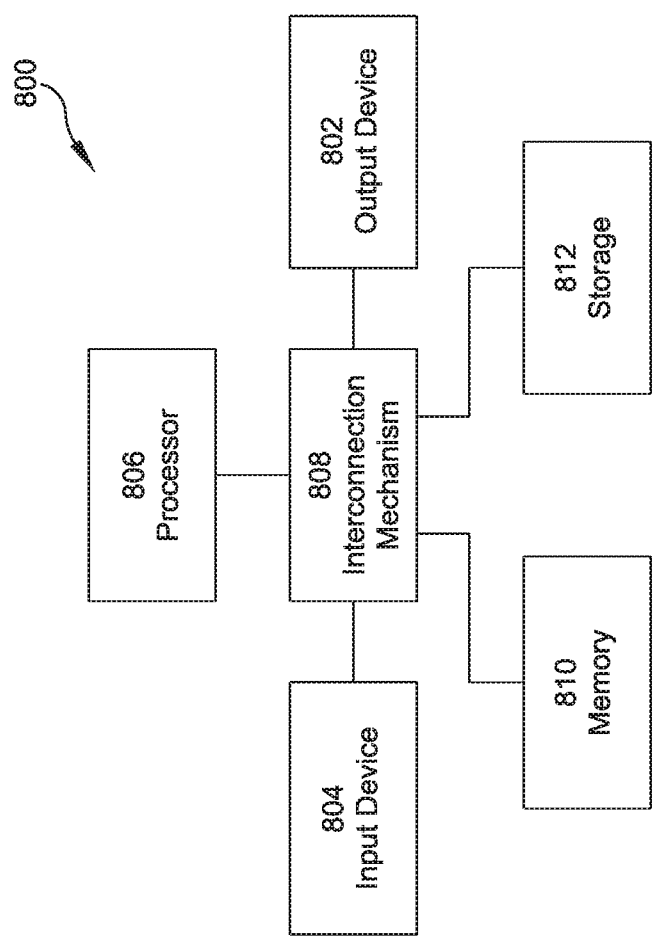
FIG. 8 is a block diagram illustrating a controller architecture according to one embodiment.

FIG. 8 illustrates an example block diagram of computing components forming a system 800 which may be configured to implement one or more aspects disclosed herein. For example, the system 800 may be communicatively coupled to or included within one or more of the IEDs 102.

The system 800 may include for example a general-purpose computing platform such as those based on Intel PENTIUM-type processor, Motorola PowerPC, Sun Ultra-SPARC, Texas Instruments-DSP, Hewlett-Packard PA-RISC processors, or any other type of processor. System 800 may include specially-programmed, special-purpose hardware, for example, an application-specific integrated circuit (ASIC). Various aspects of the present disclosure may be implemented as specialized software executing on the system 800 such as that shown in FIG. 8.

The system 800 may include a processor/ASIC 806 connected to one or more memory devices 810, such as a disk drive, memory, flash memory or other device for storing data. Memory 810 may be used for storing programs and data during operation of the system 800. Components of the computer system 800 may be coupled by an interconnection mechanism 808, which may include one or more buses (e.g., between components that are integrated within a same machine) and/or a network (e.g., between components that reside on separate machines). The interconnection mechanism 808 enables communications (e.g., data, instructions) to be exchanged between components of the system 800.

The system 800 also includes one or more input devices 804, which may include for example, a keyboard or a touch screen. The system 800 includes one or more output devices 802, which may include for example a display. In addition, the computer system 800 may contain one or more interfaces (not shown) that may connect the computer system 800 to a communication network, in addition or as an alternative to the interconnection mechanism 808.

The system 800 may include a storage system 812, which may include a computer readable and/or writeable nonvolatile medium in which signals may be stored to provide a program to be executed by the processor or to provide information stored on or in the medium to be processed by the program. The medium may, for example, be a disk or flash memory and in some examples may include RAM or other non-volatile memory such as EEPROM. In some embodiments, the processor may cause data to be read from the nonvolatile medium into another memory 810 that allows for faster access to the information by the processor/ASIC than does the medium. This memory 810 may be a volatile, random access memory such as a dynamic random access memory (DRAM) or static memory (SRAM). It may be located in storage system 812 or in memory system 810. The processor 806 may manipulate the data within the integrated circuit memory 810 and then copy the data to the storage 812 after processing is completed. A variety of mechanisms are known for managing data movement between storage 812 and the integrated circuit memory element 810, and the disclosure is not limited thereto. The disclosure is not limited to a particular memory system 810 or a storage system 812.

The system 800 may include a general-purpose computer platform that is programmable using a high-level computer programming language. The system 800 may be also implemented using specially programmed, special purpose hardware, e.g. an ASIC. The system 800 may include a processor 806, which may be a commercially available processor such as the well-known Pentium class processor available from the Intel Corporation. Many other processors are available. The processor 806 may execute an operating system which may be, for example, a Windows operating system available from the Microsoft Corporation, MAC OS System X available from Apple Computer, the Solaris Operating System available from Sun Microsystems, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

Furthermore, in some embodiments the controller 110 may be external to the one or more IEDs 102, while in some embodiments the controller 110 may be internal to each of the one or more IEDs 102. Accordingly, the foregoing analysis procedures can be executed by each of the one or more IEDs 102 discussed above, or may be executed partially or exclusively by an entity (e.g., the controller 110) external to the one or more IEDs 102.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A method for analyzing waveform capture data in an electrical system, the method comprising:
   measuring electrical signals in the electrical system using an intelligent electronic device (IED);
   detecting an electrical event in the electrical system based on the measured electrical signals;
   in response to detecting the electrical event, generating a waveform capture illustrating the electrical event on the IED;
   receiving, at an input of a controller coupled to the IED, the waveform capture from the IED;
   extracting electrical event data from the waveform capture;
   performing a partial event classification on the waveform capture using the extracted electrical event data pursuant to a selected power quality standard;
   evaluating the partial event classification against metadata, IED information and additional event data to develop a refined event classification, the refined event classification indicating symptoms of the electrical event;

diagnosing the electrical event and a cause of the electrical event based on a comparison of the indicated symptoms of the electrical event and stored event data, the stored event data including previously-stored electrical event symptoms and diagnosed causes of electrical events; and automatically initiating corrective or mitigative steps using the controller to fix the cause of the electrical event.

2. The method of claim 1, further comprising:
analyzing waveform capture data that includes waveform disturbances caused by known electrical events; and
writing analysis results into the stored event data.

3. The method of claim 1, further comprising requesting additional information from the IED.

4. The method of claim 3, further comprising modifying a diagnosis based in part on the additional information.

5. The method of claim 1, wherein automatically initiating corrective or mitigative steps to fix the cause of the electrical event includes disconnecting a malfunctioning component determined to be the cause of the electrical event.

6. The method of claim 1, wherein automatically initiating corrective or mitigative steps to fix the cause of the electrical event includes changing a mode of operation of a component determined to be the cause of the electrical event.

7. The method of claim 1, further comprising: providing an indication of the cause of the electrical event.

8. The method of claim 1, wherein diagnosing the electrical event includes determining a location of the electrical event.

9. The method of claim 1, wherein the electrical signals are measured using a plurality of IEDs, and wherein diagnosing the electrical event includes determining a location of the electrical event, wherein the location of the electrical event is determined based on a location of an IED of the plurality of IEDs for which the electrical event is most severe.

10. The method of claim 1, wherein the electrical event corresponds to an electrical disturbance, and the electrical disturbance includes at least one of a voltage sag and a voltage swell.

11. The method of claim 1, wherein performing the partial event classification on the waveform capture includes partially classifying the waveform capture into one of a plurality of classifications based on criteria defining the classifications from the selected power quality standard.

12. The method of claim 1, wherein the selected power quality standard includes at least one of IEEE 1159, IEC 61000-4-30, and EN50160.

13. The method of claim 1, wherein the IED information includes at least one of: sampling rate of the IED, anti-aliasing capabilities of the IED, accuracy of the IED, configuration information associated with the IED, IED potential transformer (PT) and current transformer (CT) information, IED PT/CT ratio information, IED power quality capabilities, IED blind or zero-blind sampling characteristics, IED system type, IED system time synchronization information, IED system clock accuracy, and other characteristics inherent to the IED.

14. The method of claim 1, wherein the metadata includes data indicative of the context in which the waveform capture data was acquired.

15. The method of claim 14, wherein the data indicative of the context in which the waveform capture data was acquired includes at least one of: load type information, load characteristic information, IED locational information, IED hierarchical information, utility service type information, temporal and seasonal information, environmental information, user information, and user operational characteristics.

16. The method of claim 1, wherein the event data includes data descriptive of the electrical event.

17. The method of claim 16, wherein the data descriptive of the electrical event includes at least one of: instantaneous time-series waveform data, RMS time-series waveform data, event magnitude, event duration, unit range or scale, affected phase or phases, synchronicity of the electrical event on the affected phases, number of system phases, non-fundamental frequency data associated with the event, oscillatory information, symmetry of event, initial polarity of event, event location, recurrence and repetition information, date and time data, onset rate characteristics, recovery rate characteristics, periodicity information, frequency correlation information, affected device information, pre-event data, event data, and post-event data.

18. A waveform analysis system, the system comprising:
at least one intelligent electronic device configured to:
measure electrical signals in an electrical system;
detect an electrical event in the electrical system based on the measured electrical signals; and
in response to detecting the electrical event, generate a waveform capture illustrating the electrical event; and a controller having at least one memory and configured to:
receive the waveform capture from the at least one intelligent electronic device;
extract electrical event data from the waveform capture;
perform a partial event classification on the waveform capture using the extracted electrical event data pursuant to a selected power quality standard;
evaluate the partial event classification against metadata, IED information and additional event data to develop a refined event classification, the refined event classification indicating symptoms of the electrical event;
diagnose the electrical event and a cause of the electrical event based on a comparison of the indicated symptoms of the electrical event and stored event data, the stored event data including previously-stored electrical event symptoms and diagnosed causes of electrical events; and
automatically initiating corrective or mitigative steps using the controller to fix the cause of the electrical event.

19. The system of claim 18, wherein the controller is further configured to:
analyze waveform capture data including waveform disturbances caused by known electrical events; and
write analysis results into the at least one memory.

20. The system of claim 18, wherein the controller is further configured to request additional information from the at least one intelligent electronic device.

21. The system of claim 20, wherein the controller is further configured to modify a diagnosis based in part on the additional information.

22. The system of claim 18, wherein automatically initiating corrective or mitigative steps to fix the cause of the electrical event includes disconnecting, by the controller, a malfunctioning component determined to be the cause of the electrical event.

23. The system of claim 18, wherein automatically initiating corrective or mitigative steps to fix the cause of the electrical event includes changing, by the controller, a mode of operation of a component determined to be the cause of the electrical event.

\* \* \* \* \*